US012322685B2

(12) United States Patent
Perez-Corona et al.

(10) Patent No.: US 12,322,685 B2
(45) Date of Patent: Jun. 3, 2025

(54) INTEGRATED CIRCUIT (IC) PACKAGE WITH SUBSTRATE HAVING VALIDATION CONNECTORS

(71) Applicant: Intel Corporation, Santa Clara, CA (US)

(72) Inventors: Luis Ricardo Perez-Corona, Tlaquepaque (MX); Maria Jose Garcia-Garcia de Leon, Zapopan (MX); Ricardo Astro-Bohorquez, Zapopan (MX); Francisco Javier Ramirez-Aldana, Zapopan (MX)

(73) Assignee: Intel Corporation, Santa Clara, CA (US)

( * ) Notice: Subject to any disclaimer, the term of this patent is extended or adjusted under 35 U.S.C. 154(b) by 1190 days.

(21) Appl. No.: 16/895,964

(22) Filed: Jun. 8, 2020

(65) Prior Publication Data

US 2020/0303291 A1     Sep. 24, 2020

(51) Int. Cl.
*H01L 23/498*     (2006.01)
*H01L 23/00*     (2006.01)

(52) U.S. Cl.
CPC ........ *H01L 23/49816* (2013.01); *H01L 24/14* (2013.01); *H01L 24/81* (2013.01); *H01L 2224/1451* (2013.01)

(58) Field of Classification Search
CPC ... H01L 23/49816; H01L 24/14; H01L 24/81; H01L 2224/1451; H01L 2224/05551; H01L 2224/0226; H01L 24/03; H01L 2924/0002; H01L 2924/00; H01L 2224/05647; H01L 2924/00014; H01L 2924/05442; H01L 2224/0346; H01L 23/481; H01L 21/76834; H01L 21/3212; H01L 2224/0557; H01L 2224/0401; H01L 2224/02125; H01L 21/76816; H01L 24/05; H05K 1/147; H05K 1/141; H05K 1/189; H05K 3/368; H05K 2201/10189; H05K 2201/10325; H05K 2201/10704;
(Continued)

(56) References Cited

U.S. PATENT DOCUMENTS 6,347,946 B1 * 2/2002 Trobough .............. H05K 1/147
                                                                         439/70
9,763,329 B1 * 9/2017 Mason .................... H05K 1/181
(Continued)

*Primary Examiner* — Kyoung Lee
(74) *Attorney, Agent, or Firm* — Schwabe, Williamson & Wyatt, P.C.

(57) ABSTRACT

Embodiments herein describe techniques for an IC package including a package substrate. The package substrate includes a set of validation connectors formed on a first side of the package substrate, a first set of functional connectors formed on the first side of the package substrate, and a second set of functional connectors formed on a second side of the package substrate opposite to the first side. A validation connector of the set of validation connectors is arranged to be coupled with a validation connector of an IC die placed above the first side of the package substrate. A first functional connector of the first set of functional connectors is arranged to be coupled with a functional connector of the IC die. A second functional connector of the second set of functional connectors is arranged to be coupled through the first functional connector to the functional connector of the IC die.

25 Claims, 8 Drawing Sheets

(58) Field of Classification Search
CPC ...... H01R 12/62; H01R 13/193; H01R 12/58;
H01R 12/51; H01R 12/82; H01R 12/59;
G01R 1/0416; G01R 1/0483
See application file for complete search history.

(56) References Cited

U.S. PATENT DOCUMENTS

| | | | |
|---|---|---|---|
| 2006/0206763 A1* | 9/2006 | Kudo | G06F 11/3656 714/E11.17 |
| 2010/0252920 A1* | 10/2010 | Trobough | H01L 22/14 257/690 |
| 2014/0239994 A1* | 8/2014 | Alves Moreira | G01R 1/067 324/754.03 |
| 2017/0117198 A1* | 4/2017 | Kim | H01L 23/49838 |
| 2020/0243429 A1* | 7/2020 | Lai | H01L 25/10 |
| 2021/0096173 A1* | 4/2021 | Chen | G01R 31/2886 |

* cited by examiner

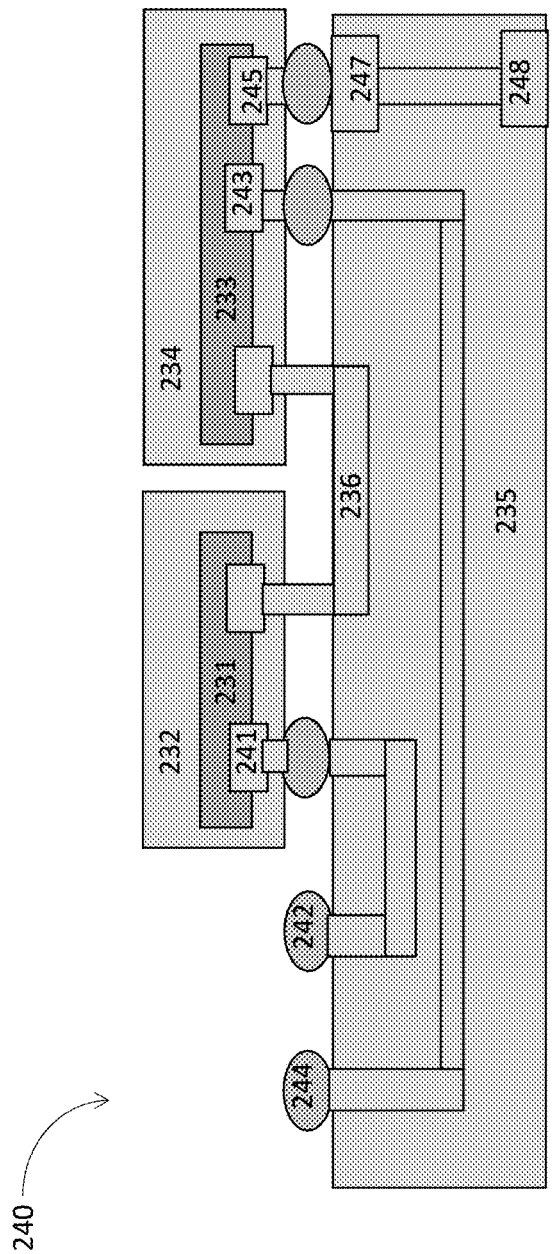

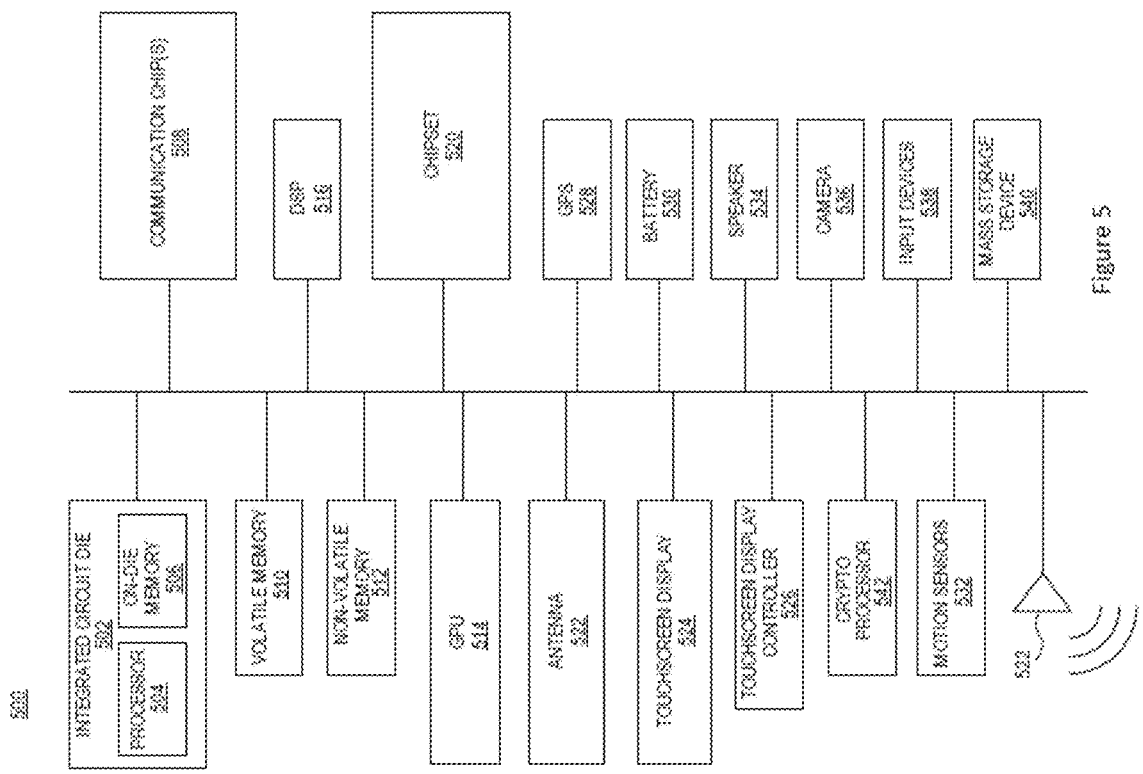

INTEGRATED CIRCUIT (IC) PACKAGE WITH SUBSTRATE HAVING VALIDATION CONNECTORS

FIELD

Embodiments of the present disclosure generally relate to the field of integrated circuit (IC), and more particularly, to IC packages with substrate having validation connectors.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

An electronic component, e.g., an integrated circuit (IC) chip or a die, may be coupled with other electronic components through integration into an IC package that can be attached to a printed circuit board (PCB) or a platform. Various packing technologies, e.g., flip-chip packages, complex system-in-packages (SiPs), multi-chip packages (MCPs), and more, have been developed. An IC chip or an IC die may have signals dedicated to validating its intended functions by monitoring the operations of the IC die. The number of these validation signals have increased significantly in recent years. Adding pins and increasing the package substrate size have been the typical solution to the increasing number of validation signals. However, such a solution may cause valuable resources from silicon, package, and platform not used for the intended functions of IC dies, which not only adds cost to the products, but also potentially creates reliability, thermal, and mechanical problems. Improvements are desired for resources of silicon, package, and platform to be used for the intended functions.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 5 schematically illustrates a computing device built in accordance with an embodiment of the disclosure, in accordance with various embodiments.

DETAILED DESCRIPTION

Figure 1:
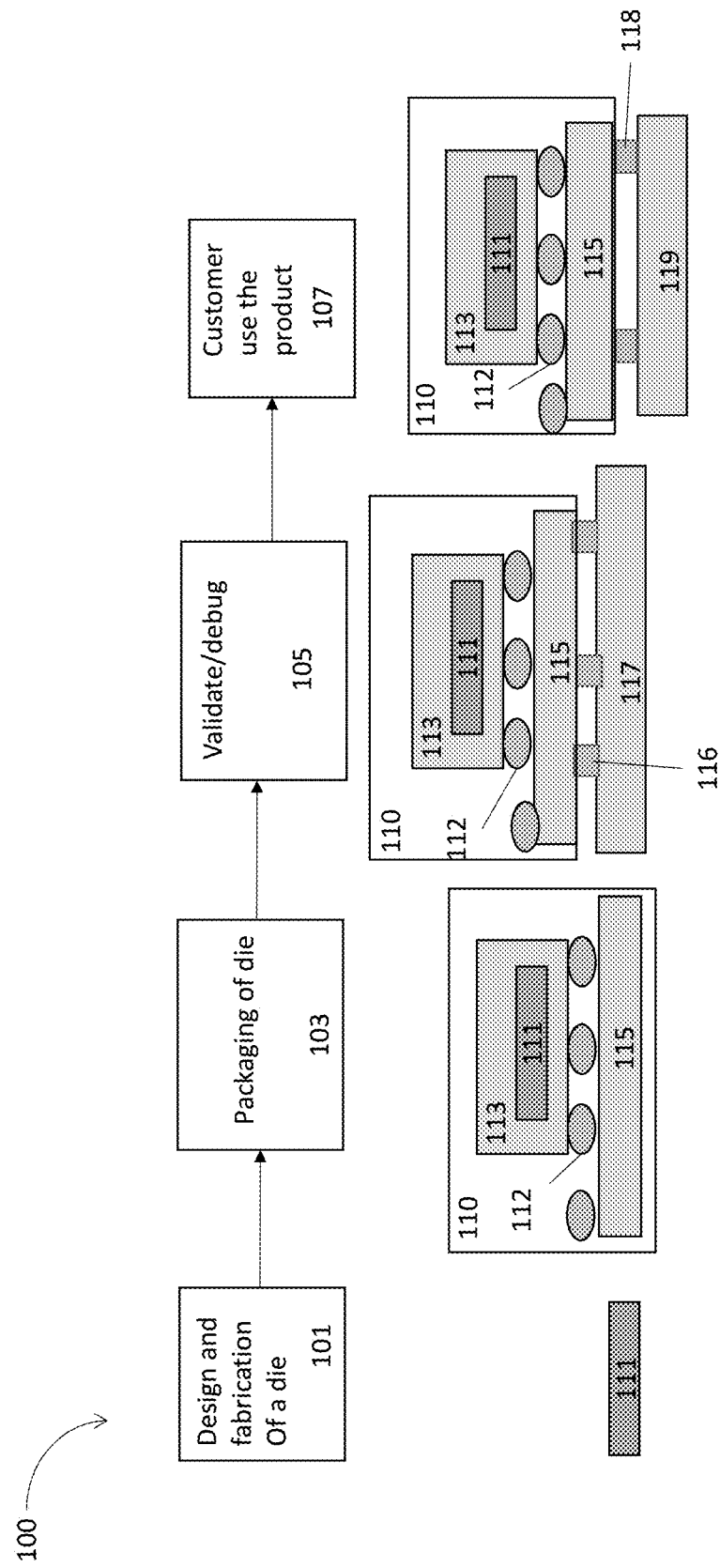
FIG. 1 schematically illustrates an example product-development process for an integrated circuit (IC) package, in accordance with various embodiments.

An integrated circuit (IC) package, which may also be referred to as a microelectronics package, or simply a package, may include one or more electronic components or components, e.g., an IC chip, an IC die, or simply referred to as a die, placed on a package substrate, which may be further attached to a printed circuit board (PCB). Components are used here broadly, which may refer to any object in a package, e.g., PCB, an interposer, a patch, a substrate, a package substrate, a chip, a die, a wafer, or other components. In embodiments, an IC die or a die may be used as an example of a component. Descriptions about an IC die may be equally applicable to other components of a package. A substrate may refer to a package substrate.

An IC chip or an IC die is designed and manufactured by a manufacturer with intended functions for an external customer. In addition, an IC die may have signals dedicated to validating its intended functions by monitoring the operations of the IC die. The number of these validation signals have increased significantly in recent years. Adding pins and increasing the package substrate size have been the typical solution to the increasing number of validation signals. For example, the latest Xeon® designs use over 100 pins for driving observability and monitoring debug signals. Similarly, an Intel® reference platform may have over 200 nets routed for the validation purpose. However, such a solution may cause valuable resources from silicon, package, and platform not used for the intended functions of IC dies, which not only adds cost to the products, but also potentially creates reliability, thermal, and mechanical problems. Furthermore, those added pins in the increased area of the package substrate are likely not further used by customers in customers' platform or board designs for the intended functions of an IC after the production release by the manufacturer. Hence, the added package substrate areas likely do not bring a tangible benefit to the customers. Valuable silicon area of an IC die and connections, e.g., pins, are lost to the validation process and not used for the intended functions, resulting in higher cost to the customers. Some solutions, e.g., handmade re-work, may be susceptible to failure and destructive damage.

Embodiments herein present a package substrate with improved designs for routing the debug and validation signals. Embodiments herein may include a standard pad pattern for a set of validation connectors, a socket coupled to the validation connectors, and an interposer that upholds the testing connectors providing physical access. A package substrate may include a set of validation connectors or pads formed at the top side of the package substrate to route validation signals from one part of the top side to another part of the top side of the package substrate without going through the package substrate. A removable socket may be coupled to the set of validation connectors. The removable socket may be placed on top of the validation connectors to achieve proper mechanical pressure and electrical connection between the validation connectors and the interposer that upholds the validation connectors. A standard pad pattern of the validation connectors may be designed to support multiple IC dies to share the same validation connectors. Therefore, a single validation tool can be used for multiple purposes to validate multiple IC dies in different programs, as well as by external customers for their validation efforts. As a result, an IC die may have improved functional pins to increase or improve input/output (IO) and power performance. In addition, a reference platform, which may be a PCB, may be designed simpler and more similar to actual customer's platforms, since the validation signals are not routed through the reference platform. The number of PCB layers for the reference platform may be reduced as well. Moreover, placing the validation connectors at the top side of the package substrate may enable customers to access the validation signals in a fast, easy, and reliable way. In some embodiments, the validation connectors at the top side of the package substrate may be applicable to include other high-speed IOs, extending motherboard capabilities when desired.

Embodiments herein present an IC package including a package substrate. The package substrate includes a set of validation connectors, a first set of functional connectors, and a second set of functional connectors. The set of validation connectors is formed on a first side of the package substrate. A validation connector of the set of validation connectors is arranged to be coupled with a validation connector of an IC die placed above the first side of the package substrate. The first set of functional connectors is formed on the first side of the package substrate. A first functional connector of the first set of functional connectors is arranged to be coupled with a functional connector of the IC die. The second set of functional connectors is formed on a second side of the package substrate, where the second side is opposite to the first side of the package substrate. A second functional connector of the second set of functional connectors is arranged to be coupled through the first functional connector to the functional connector of the IC die.

In embodiments, a method for forming an IC package is presented. The method includes providing a package substrate, wherein the package substrate includes a set of validation connectors formed on a first side of the package substrate, a first set of functional connectors formed on the first side of the package substrate, and a second set of functional connectors formed on a second side of the package substrate, wherein the second side is opposite to the first side of the package substrate. The method further includes placing an IC die above the first side of the package substrate, where a validation connector of the set of validation connectors is arranged to be coupled with a validation connector of an IC die, and a first functional connector of the first set of functional connectors is arranged to be coupled with a functional connector of the IC die.

Embodiments herein may present a computing device, which may include a circuit board, and an integrated circuit (IC) package attached to the circuit board. The IC package includes a package substrate. The package substrate includes a set of validation connectors, a first set of functional connectors, and a second set of functional connectors. The set of validation connectors is formed on a first side of the package substrate. A validation connector of the set of validation connectors is arranged to be coupled with a validation connector of an IC die placed above the first side of the package substrate. The first set of functional connectors is formed on the first side of the package substrate. A first functional connector of the first set of functional connectors is arranged to be coupled with a functional connector of the IC die. The second set of functional connectors is formed on a second side of the package substrate, where the second side is opposite to the first side of the package substrate. A second functional connector of the second set of functional connectors is arranged to be coupled through the first functional connector to the functional connector of the IC die.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

FIG. 1 schematically illustrates an example product-development process 100 for an integrated circuit (IC) package, in accordance with various embodiments.

In embodiments, the product-development process 100 may include a stage 101 when an IC die may be designed and fabricated, a stage 103 when the die may be packaged, a stage 105 when the die may be validated and debugged on a reference platform, and a stage 107 when the die may be used in a customer's product.

In embodiments, for example, a die 111 may be designed and fabricated at the stage 101. In detail, the die 111 may be fabricated on a wafer. The IC die 111 may include a capacitor, an mmWave antenna module, a central processing unit (CPU), a graphic processing unit (GPU), a memory chip, a phase-locked loop (PLL) chip, an input/output (I/O) interface chip, an application specific integrated circuit, a field-programmable gate array, a high-bandwidth memory, a package-embedded memory, a random access memory, a flash memory, an embedded nonvolatile memory, a graphics card, a III-V die, an accelerator, a capacitor, a passive component, an inductor, an active component, a three-dimensional integrated circuit (3D IC), a high-bandwidth memory (HBM), a double data rate (DDR) memory, or other ICs.

At the stage 103, an IC package 110 may be formed to include the die 111, an encapsulation layer or a heat spreader layer 113, and a package substrate 115 incorporated with the teachings of the present disclosure, described more fully below. Multiple connectors 112, e.g., a pin, a solder ball, a micro ball, a solder bump, a controlled-collapse chip connection (C4) bump, a bonding pad, a through via, a micro via, may be between the die 111 and the package substrate 115. More details of a package substrate are shown in FIGS. 2(a)-2(d). In embodiments, the IC package 110 may be a chip scale package (CSP), a wafer-level package (WLP), a stacked IC package, a system-in-package (SiP), a multi-chip package (MCP), a quad-flat no-leads (QFN) package, a dual-flat no-leads (DFN) package, a flip chip package, or a ball grid array (BGA) package.

At the stage 105, the IC package 110 may be placed on a reference platform 117, which may be a PCB, to perform validation of the die 111, taking advantage of the teachings of the present disclosure incorporated in substrate 115. The IC package 110 may be coupled to the reference platform 117 by connectors 116. Tasks performed at the stage 105 may include validation, testing, debugging, verification, diagnosing, or any other tasks related to ensure the intended functions of the die 111 are achieved. In embodiments, validation is used as an example of such variety of tasks.

At the stage 107, the IC package 110 may be released to the customer to perform its intended functions. The customer may place the IC package 110 on a customer platform 119. The IC package 110 may be coupled to the customer platform 119 by connectors 118. In embodiments, the reference platform 117 and the customer platform 119 may have similar design and perform similar functions, because the reference platform 117 does not need to perform additional validation tasks by virtue of the improvements provided to substrate 115. Different from the embodiments, current solutions for the reference platform may include additional validation connectors to perform validation related tasks for the IC die 111. Hence, the improvements on the package substrate 115 also brings improvements on the reference platform 117.

Figure 2A:
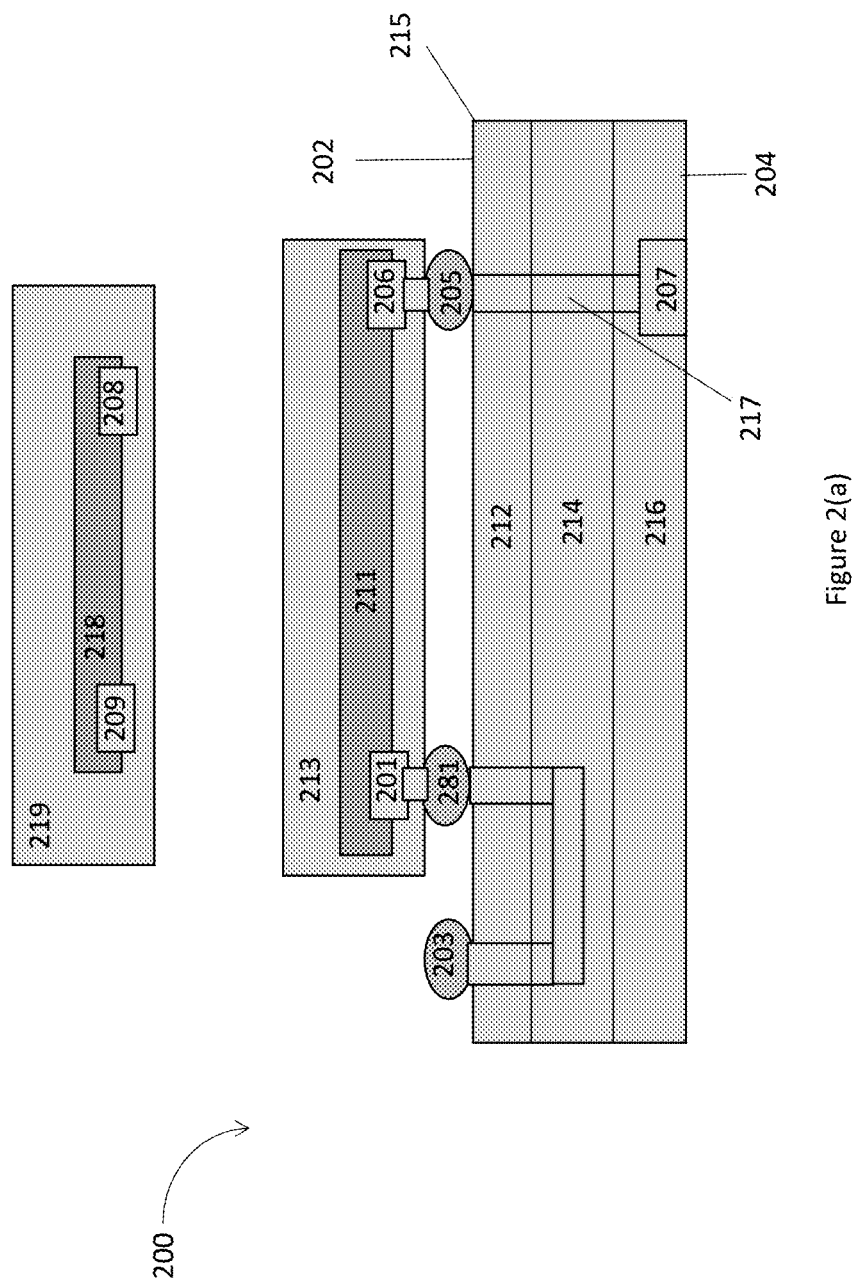
FIGS. 2(*a*)-2(*d*) schematically illustrate various IC packages including a package substrate having a set of validation connectors, in accordance with various embodiments.
Figure 2B:
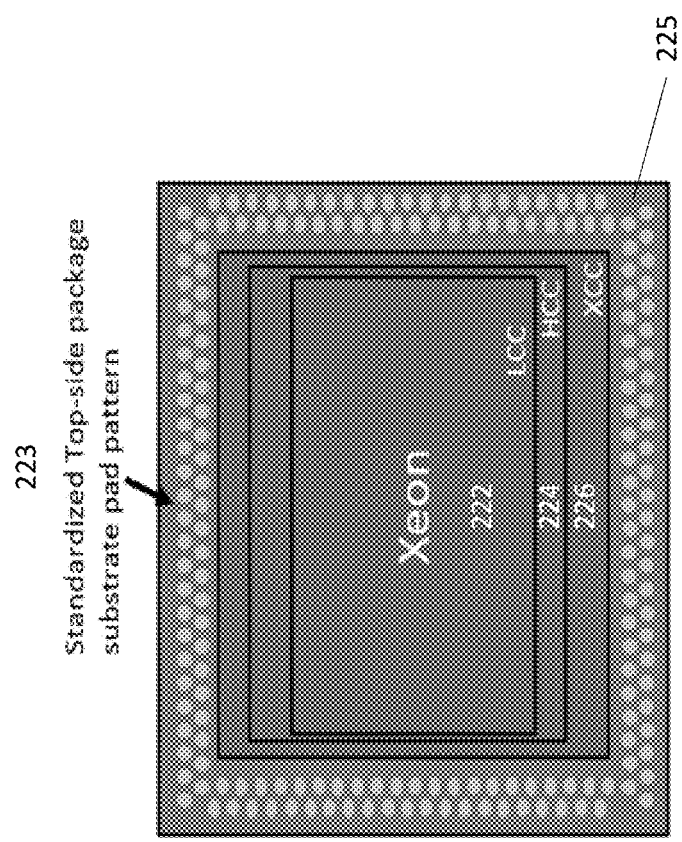
Figure 2D:
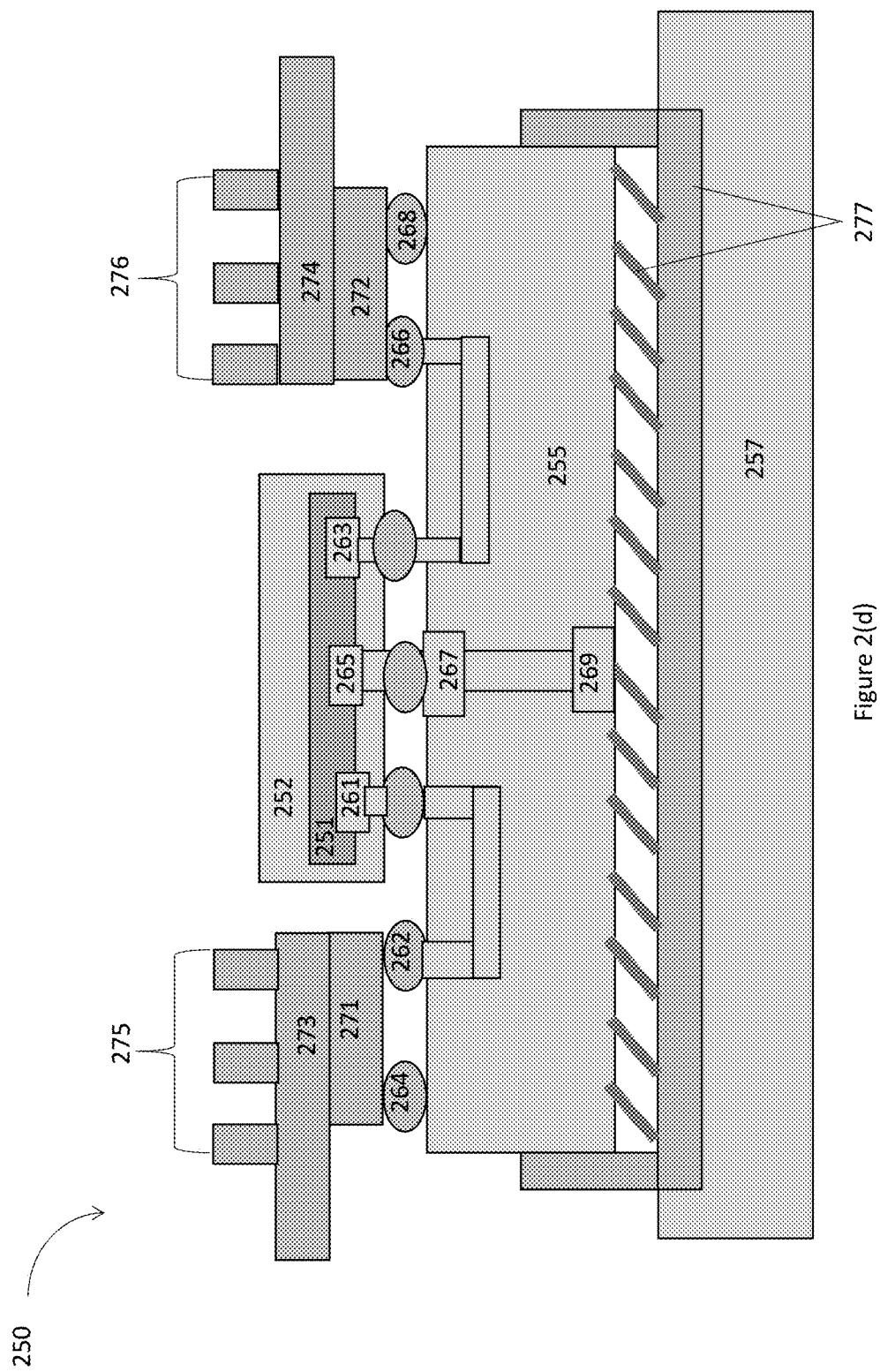

FIGS. 2(a)-2(d) schematically illustrate various IC packages including a package substrate having a set of validation connectors, in accordance with various embodiments. FIG. 2(a) shows an IC package 200 including a package substrate 215, FIG. 2(c) shows an IC package 240 including a package substrate 235, and FIG. 2(d) shows an IC package 250 including a package substrate 255. Package substrates 215, 235 and 255 are incorporated with the teachings of the present disclosure, described more fully below. The IC package 200, the IC package 240, and the IC package 250 may be examples of the IC package 110 shown in FIG. 1. The package substrate 215, the package substrate 235, and the package substrate 255 may be examples of the package substrate 115 shown in FIG. 1.

In embodiments, as shown in FIG. 2(a) as a side view, the IC package 200 includes the package substrate 215 and an IC die 211 covered by an encapsulation layer or a heat spreader layer 213. The IC die 211 is placed above a first side 202 of the package substrate 215. The package substrate 215 includes a set of validation connectors, e.g., a validation connector 203, a validation connector 281, a first set of functional connectors, e.g., a first functional connector 205, and a second set of functional connectors, e.g., a second functional connector 207. The set of validation connectors is formed on the first side 202 of the package substrate 215. The validation connector 203 or the validation connector 281 of the set of validation connectors is arranged to be coupled with a validation connector 201 of the IC die 211. The validation connector 281 is below the IC die 211, while the validation connector 203 is located in a point not overlapped with the IC die 211 so that other components, a socket, may be placed on top of the validation connector 203. The first set of functional connectors is formed on the first side 202 of the package substrate 215. The first functional connector 205 of the first set of functional connectors is arranged to be coupled with a functional connector 206 of the IC die 211. The second set of functional connectors is formed on a second side 204 of the package substrate 215, where the second side 204 is opposite to the first side 202 of the package substrate 215. The second functional connector 207 of the second set of functional connectors is coupled through the first functional connector 205 to the functional connector 206 of the IC die 211.

In embodiments, the validation connector 203, the validation connector 281, the first functional connector 205, and the second functional connector 207 may be any conductive connector, e.g., a pin, a solder ball, a micro ball, a solder bump, a controlled-collapse chip connection (C4) bump, a bonding pad, a through via, a micro via. In some embodiments, the validation connector 203, the first functional connector 205, and the second functional connector 207 may include more than one connectors coupled directly together. Even though only one validation connector, the validation connector 203, is shown, there may be multiple validation connectors placed in the proximity of the validation connector 203. In embodiments, the set of validation connectors, the first set of functional connectors, or the second set of functional connectors form a micro pin-grid array (PGA), a land-grid array (LGA), a fine-pitch ball-grid-array (FPBGA), or a ball grid array (BGA).

In embodiments, the package substrate 215 includes various layers, e.g., an uppermost layer 212, an intermediate core substrate 214, and a lowest layer 216. The uppermost layer 212 or the lowest layer 216 may be a solder resist layer, a metal layer, a mold layer, or other layers. The layer 212 or the layer 216 may include multiple sublayers, e.g., an underfill layer. The underfill layer may include epoxy resin, acrylates, bismaleimides, polyesters, polyimides, polyolefins, polystyrene, polyurethanes, polyurethane resin, silicone resin, or polyester resin, silica, alumina, boron nitride, zinc oxide, a filler material, colorants, inhibitors, ion trappers, stress absorbers, polymers, surfactants, binding agents, fluxing agents, or additives. The intermediate core substrate 214 may include a polymeric substrate, a non-polymeric substrate, a silicon substrate, a silicon on insulator (SOI) substrate, a silicon on sapphire (SOS) substrate. A through via 217 may be through the multiple layers of the package substrate 215.

In embodiments, the IC die 211 may be a first IC die, which may be replaced by a second IC die, e.g., an IC die 218 covered by an encapsulation layer or a heat spreader layer 219. The IC die 218 may include a validation connector 209, and a functional connector 208. The IC die 218 may be placed above the first side 202 of the package substrate 215, to have the validation connector 209 coupled to the validation connector 203, and to have the functional connector 208 coupled with the first functional connector 205, and further coupled to the second functional connector 207 through the first functional connector 205. Hence, the set of validation connectors of the package substrate 215 can be shared by multiple IC dies to validate multiple IC dies at different times. In some embodiments, the IC die 218 is a different IC from the IC die with different functions, but having compatible connectors 201/206 and 209/208

In embodiments, as shown in FIG. 2(b) in a top down view, a set of validation connectors 223 may be located at the top side of a package substrate 225. The set of validation connectors 223 may be shared by multiple IC dies, e.g., a Xeon® LCC die 222, a Xeon® HCC die 224, or a Xeon® XCC die 226. For example, any one of a Xeon® LCC die 222, a Xeon® HCC die 224, or a Xeon® XCC die 226, may be placed above the package substrate 225, so that the set of validation connectors 223 are coupled with validation connectors of Xeon® LCC die 222, Xeon® HCC die 224, or Xeon® XCC die 226. The Xeon® LCC die 222, the Xeon® HCC die 224, or the Xeon® XCC die 226 may be placed above the package substrate 225 at different times interchangeably. The Xeon® LCC die 222 consumes a smaller area and less power than the Xeon® HCC die 224, which consumes a smaller area and less power than the Xeon® XCC die 226. The Xeon® dies are used as examples only, other IC dies may be used instead of Xeon® dies.

In embodiments, as shown in FIG. 2(c), the IC package 240 includes the package substrate 235, an IC die 231 covered by an encapsulation layer or a heat spreader layer 232, and an IC die 233 covered by an encapsulation layer or a heat spreader layer 234. The IC die 231 and the IC die 233 may be coupled together by a silicon bridge 236 within the package substrate 235. The IC die 231 and the IC die 233 are placed above a first side of the package substrate 235. The package substrate 235 includes a set of validation connectors, e.g., a validation connector 242, a validation connector 244, a first set of functional connectors, e.g., a first functional connector 247, and a second set of functional connectors, e.g., a second functional connector 248. The set of validation connectors is formed on the first side of the package substrate 235. The validation connector 242 is arranged to be coupled with a validation connector 241 of the IC die 231, and the validation connector 244 is arranged to be coupled with a validation connector 243 of the IC die 233. The first set of functional connectors is formed on the first side of the package substrate 235. The first functional connector 247 of the first set of functional connectors is arranged to be coupled with a functional connector 245 of the IC die 233. The second set of functional connectors is formed on a second side of the package substrate 235, where the second side is opposite to the first side of the package substrate 235. The second functional connector 248 of the second set of functional connectors is coupled through the first functional connector 247 to the functional connector 245 of the IC die 233.

In embodiments, as shown in FIG. 2(d), the IC package 250 includes the package substrate 255, an IC die 251 covered by an encapsulation layer or a heat spreader layer 252. The IC die 251 is placed above a first side of the package substrate 255. The package substrate 255 includes a set of validation connectors, e.g., a validation connector 262, a validation connector 264, a validation connector 266, a validation connector 268, and more. The validation connector 262 is coupled with a validation connector 261 of the IC die 251, while the validation connector 266 is coupled with a validation connector 263 of the IC die 251. The IC die 251 is placed above the first side of the package substrate 255, between the validation connector 262 and the validation connector 266. The package substrate 255 may have multiple functional connectors arranged to be coupled with functional connectors of the IC die 251. For example, a function connector 267 is located at the first side of the package substrate 255, and a function connector 269 is located at the second side of the package substrate 255, both are coupled to a functional connector 265 of the IC die 251.

In embodiments, a socket 271 is placed above the first side of the package substrate, where the socket 271 is coupled to the set of validation connectors, e.g., the validation connector 262, and the validation connector 264. An interposer 273 is placed above the socket 271 and coupled to the socket 271. Optionally and similarly, a socket 272 is placed above the first side of the package substrate, where the socket 272 is coupled to the set of validation connectors, e.g., the validation connector 266, and the validation connector 268. An interposer 274 is placed above the socket 272 and coupled to the socket 272. One or more connectors, e.g., connectors 275 or connectors 276, may be coupled to the interposer 273 or the interposer 274. The package substrate 255 may be placed above a platform 257, which may be a PCB. Connectors 277 may be between the package substrate 255 and the platform 257.

In embodiments, the multiple validation connectors, e.g., the validation connector 262, the validation connector 264, the validation connector 266, the validation connector 268, may form a standard pad pattern designed to have full compatibility among several different IC dies, e.g., as shown in FIG. 2(b). Those compatible but different IC dies may belong to a same IC family, e.g., a Xeon® LCC die, a Xeon® HCC die, or a Xeon® XCC. In embodiments, the area occupied by the multiple validation connectors may be determined by the largest IC die, in terms of the area the largest IC die consumes, to be placed on the package substrate 255 and coupled to the validation connectors. The patterns may be designed to balance between the number of validation signals, the cost impact on socket design, and signal integrity performance.

In embodiments, the socket 271 or the socket 272 may have different designs based on the pitch, removal endurance, height, bandwidth, activation force, and signal integrity performance. For example, the socket 271 or the socket 272 may have a pin pitch of ~0.3 mm, a bandwidth close to 37 GHz, a low profile, and a low activation force. There exist other socket solutions in the market like polymer-based sockets. The proper selection of the sockets may depend on physical, mechanical, and electrical requirements.

In embodiments, the interposer 273 and the interposer 274 may connect the socket with the connectors 275 or the connectors 276 used to carry on the signal to either an oscilloscope or a logic analyzer through probe cables. Traditional interposer technology may be used. In addition, dielectric materials may be used to reduce material losses and gain endurance (up to 4 or 5 sequential laminations cycles). The connectors 275 or the connectors 276 may be selected to reduce its impact on the mechanical solution, particularly, the force distribution applied to the silicon die.

Figure 3:
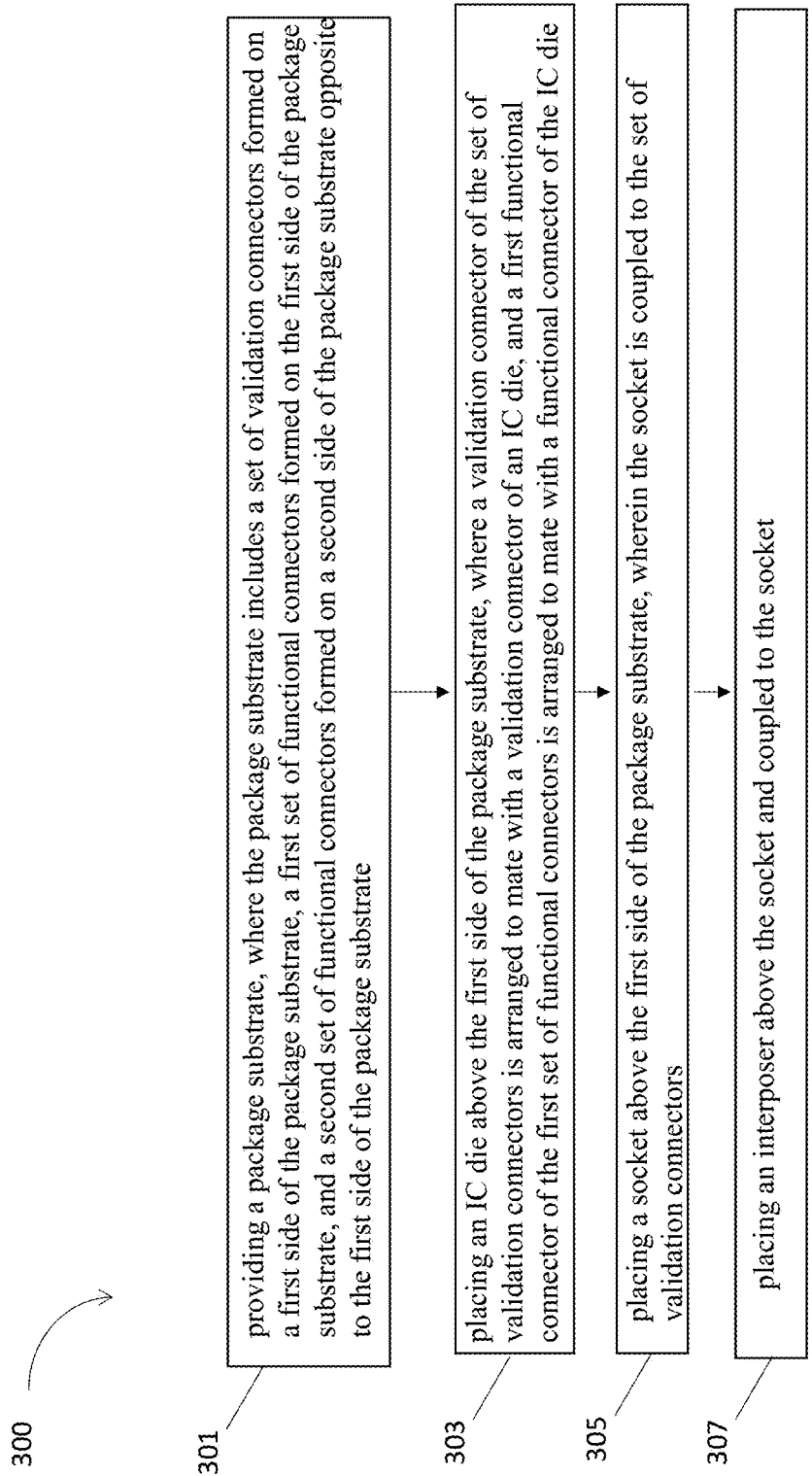
FIGS. 3-4 schematically illustrate a process for forming an IC package including a package substrate having a set of validation connectors, in accordance with various embodiments.
Figure 4:
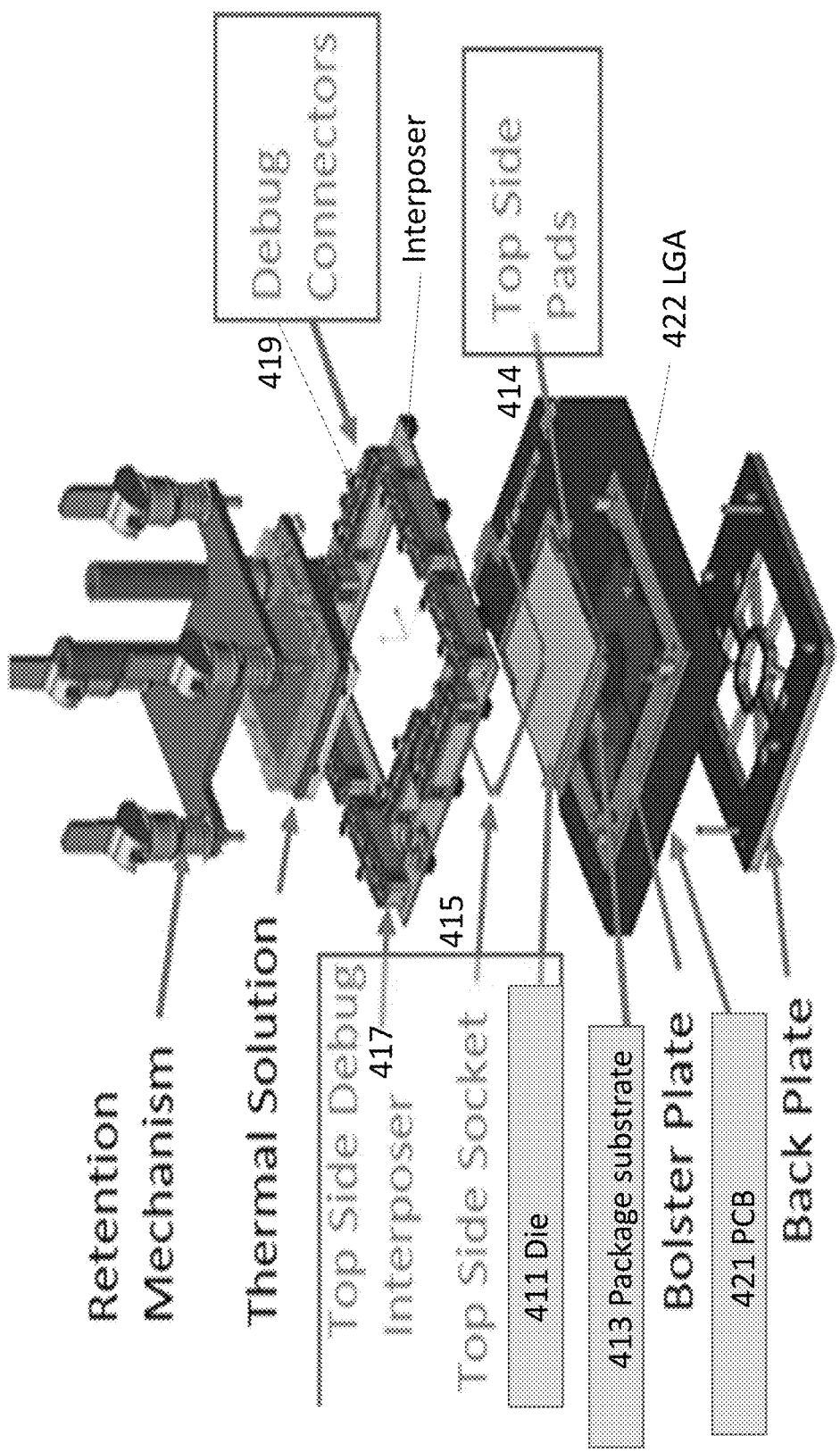

FIGS. 3-4 schematically illustrate a process 300 for forming an IC package including a package substrate having a set of validation connectors, in accordance with various embodiments. In embodiments, the process 300 may be performed to form the IC package 250 as shown in FIG. 2(d).

At a block 301, the process 300 may include providing a package substrate. The package substrate includes a set of validation connectors formed on a first side of the package substrate, a first set of functional connectors formed on the first side of the package substrate, and a second set of functional connectors formed on a second side of the package substrate opposite to the first side of the package substrate. For example, as shown in FIG. 2(d), at the block 301, the process 300 may include providing the package substrate 255. The package substrate 255 includes the set of validation connectors, e.g., the validation connector 262, the validation connector 266, formed on a first side of the package substrate 255, a first set of functional connectors, e.g., the functional connector 267, formed on the first side of the package substrate, and a second set of functional connectors, e.g., the functional connector 269, formed on a second side of the package substrate 255 opposite to the first side of the package substrate 255.

At a block 303, the process 300 may include placing an IC die above the first side of the package substrate, where a validation connector of the set of validation connectors is arranged to be coupled with a validation connector of an IC die, and a first functional connector of the first set of functional connectors is arranged to be coupled with a functional connector of the IC die. For example, as shown in FIG. 2(d), at the block 303, the process 300 may include placing the IC die 251 above the first side of the package substrate 255, where the validation connector 262 is arranged to be coupled with the validation connector 261 of the IC die 251, the functional connector 267 is arranged to be coupled with the functional connector 265 of the IC die 251.

At a block 305, the process 300 may include placing a socket placed above the first side of the package substrate, wherein the socket is coupled to the set of validation connectors. For example, as shown in FIG. 2(d), at the block 305, the process 300 may include placing the socket 271 above the first side of the package substrate 255, where the socket 271 is coupled to the set of validation connectors, e.g., the validation connector 262 and the validation connector 264.

At a block 307, the process 300 may include placing an interposer above the socket and coupled to the socket. For example, as shown in FIG. 2(d), at the block 307, the process 300 may include placing the interposer 273 above the socket 271 and coupled to the socket 271.

In addition, the process 300 may further include other operations, e.g., attaching the IC package to a printed circuit board (PCB), attaching connectors for debug or validation to the interposer, and removing the socket, the interposer, and the connectors after debugging and validation.

FIG. 4 further illustrates the process 300 in more details. The process 300 includes providing a package substrate 413, placing an IC die 411 above the first side of the package substrate 413, placing a socket 415 above the first side of the package substrate 413 to be coupled to the validation pads 414, and placing an interposer 417 above the socket 415. In some embodiments, the top side of the socket 415 may be coupled to the bottom side of the interposer 417 first, before placing both above the first side of the package substrate 413 to be coupled to the validation pads 414. A LGA 422 may be placed between the package substrate 413 and the PCB 421. A debug connector 419 is placed above the interposer 417. Supporting components, e.g., thermal solution, retention mechanism, bolster plate, and back plate, may be placed between, above, or below the different layers of components.

FIG. 5 illustrates a computing device 500 in accordance with one embodiment of the disclosure. The computing device 500 may include a number of components. In one embodiment, these components are attached to one or more motherboards or PCBs. In an alternate embodiment, some or all of these components are fabricated onto a single system-on-a-chip (SoC) die, such as a SoC used for mobile devices. The components in the computing device 500 include, but are not limited to, an integrated circuit die 502 and at least one communications logic unit 508. In some implementations the communications logic unit 508 is fabricated within the integrated circuit die 502 while in other implementations the communications logic unit 508 is fabricated in a separate integrated circuit chip that may be bonded to a substrate or motherboard that is shared with or electronically coupled to the integrated circuit die 502. The integrated circuit die 502 may include a processor 504 as well as on-die memory 506, often used as cache memory, which can be provided by technologies such as embedded DRAM (eDRAM), or SRAM. In embodiments, the computing device 500 may include a display or a touchscreen display 524, and a touchscreen display controller 526.

Computing device 500 may include other components that may or may not be physically and electrically coupled to the motherboard or fabricated within a SoC die. These other components include, but are not limited to, volatile memory 510 (e.g., dynamic random access memory (DRAM), non-volatile memory 512 (e.g., ROM or flash memory), a graphics processing unit 514 (GPU), a digital signal processor (DSP) 516, a crypto processor 542 (e.g., a specialized processor that executes cryptographic algorithms within hardware), a chipset 520, at least one antenna 522 (in some implementations two or more antenna may be used), a battery 530 or other power source, a power amplifier (not shown), a voltage regulator (not shown), a global positioning system (GPS) device 528, a compass, a motion coprocessor or sensors 532 (that may include an accelerometer, a gyroscope, and a compass), a microphone (not shown), a speaker 534, a camera 536, user input devices 538 (such as a keyboard, mouse, stylus, and touchpad), and a mass storage device 540 (such as hard disk drive, compact disk (CD), digital versatile disk (DVD), and so forth). The computing device 500 may incorporate further transmission, telecommunication, or radio functionality not already described herein. In some implementations, the computing device 500 includes a radio that is used to communicate over a distance by modulating and radiating electromagnetic waves in air or space. In further implementations, the computing device 500 includes a transmitter and a receiver (or a transceiver) that is used to communicate over a distance by modulating and radiating electromagnetic waves in air or space.

The communications logic unit 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 500 may include a plurality of communications logic units 508. For instance, a first communications logic unit 508 may be dedicated to shorter range wireless communications such as Wi-Fi, NFC, and Bluetooth and a second communications logic unit 508 may be dedicated to longer range wireless communications such as GPS, EDGE, GPRS, CDMA, WiMAX, LTE, Ev-DO, and others.

The processor 504 of the computing device 500 includes one or more devices, such as transistors. The term "processor" may refer to any device or portion of a device that processes electronic data from registers and/or memory to transform that electronic data into other electronic data that may be stored in registers and/or memory. The communications logic unit 508 may also include one or more devices, such as transistors.

In embodiments, any component, e.g., all or any combinations of components of 502-542 shown in FIG. 5, housed within the computing device 500 may be contained in an IC package formed in accordance with implementations of the current disclosure, e.g., the IC package 110 shown in FIG. 1, the IC package 200, the IC package 240, the IC package 250, as shown in FIGS. 2(*a*)-2(*d*), and an IC package formed according to the process 300 shown in FIG. 3.

In various embodiments, the computing device 500 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Some non-limiting Examples are provided below.

Example 1 may include an integrated circuit (IC) package, comprising: a package substrate, wherein the package substrate includes: a set of validation connectors formed on a first side of the package substrate, wherein a validation connector of the set of validation connectors is arranged to be coupled with a validation connector of an IC die placed above the first side of the package substrate; a first set of functional connectors formed on the first side of the package substrate, wherein a first functional connector of the first set of functional connectors is arranged to be coupled with a functional connector of the IC die; and a second set of functional connectors formed on a second side of the package substrate, wherein the second side is opposite to the first side of the package substrate, wherein a second functional connector of the second set of functional connectors is arranged to be coupled through the first functional connector to the functional connector of the IC die.

Example 2 may include the IC package of example 1 and/or some other examples herein, wherein the validation connector of the set of validation connectors is a first validation connector of the set of validation connectors, the IC die is a first IC die, and the set of validation connectors further includes a second validation connector arranged to be coupled to a validation connector of a second IC die, and wherein the second IC die is also placed above the first side of the package substrate.

Example 3 may include the IC package of example 1 and/or some other examples herein, wherein the IC die is a first IC die, and the validation connector of the set of validation connectors is arranged to be coupled with a validation connector of a second IC die replacing the first IC die; and wherein the first functional connector of the first set of functional connectors is arranged to be coupled with a functional connector of the second IC die, and the second functional connector of the second set of functional connectors is arranged to be coupled through the first functional connector to the functional connector of the second integrated circuit.

Example 4 may include the IC package of example 1 and/or some other examples herein, wherein the validation connector of the set of validation connectors is a first validation connector of a first set of validation connectors formed on the first side of the package substrate, the validation connector of the IC die is a first validation connector of the IC die; wherein the package substrate further includes a second set of validation connectors formed on the first side of the package substrate, and a second validation connector of the second set of validation connectors is arranged to be coupled with a second validation connector of the IC die; and wherein the IC die is placed above the first side of the package substrate, between the first set of validation connectors and the second set of validation connectors.

Example 5 may include the IC package of example 1 and/or some other examples herein, further comprising: a socket placed above the first side of the package substrate, wherein the socket is coupled to the set of validation connectors; and an interposer placed above the socket and coupled to the socket.

Example 6 may include the IC package of example 1 and/or some other examples herein, wherein the package substrate includes a through via, a solder resist layer, a metal layer, a mold layer, an underfill layer, or a core substrate, wherein the underfill layer includes epoxy resin, acrylates, bismaleimides, polyesters, polyimides, polyolefins, polystyrene, polyurethanes, polyurethane resin, silicone resin, or polyester resin, silica, alumina, boron nitride, zinc oxide, a filler material, colorants, inhibitors, ion trappers, stress absorbers, polymers, surfactants, binding agents, fluxing agents, or additives; and wherein the core substrate includes a polymeric substrate, a non-polymeric substrate, a silicon substrate, a silicon on insulator (SOI) substrate, a silicon on sapphire (SOS) substrate.

Example 7 may include the IC package of example 1 and/or some other examples herein, wherein at least one of the validation connector, the first functional connector, and the second functional connector is a pin, a solder ball, a micro ball, a solder bump, a controlled-collapse chip connection (C4) bump, a bonding pad, a through via, a micro via.

Example 8 may include the IC package of example 1 and/or some other examples herein, wherein the set of validation connectors, the first set of functional connectors, or the second set of functional connectors form a micro pin-grid array (PGA), a land-grid array (LGA), a fine-pitch ball-grid-array (FPBGA), or a ball grid array (BGA).

Example 9 may include the IC package of example 1 and/or some other examples herein, wherein the IC package is a chip scale package (CSP), a wafer-level package (WLP), a stacked IC package, a system-in-package (SiP), a multi-chip package (MCP), a quad-flat no-leads (QFN) package, a dual-flat no-leads (DFN) package, a flip chip package, or a ball grid array (BGA) package.

Example 10 may include the IC package of example 1 and/or some other examples herein, wherein the IC die includes a capacitor, an mmWave antenna module, a central processing unit (CPU), a graphic processing unit (GPU), a memory chip, a phase-locked loop (PLL) chip, an input/output (I/O) interface chip, an application specific integrated circuit, a field-programmable gate array, a high-bandwidth memory, a package-embedded memory, a random access memory, a flash memory, an embedded nonvolatile memory, a graphics card, a III-V die, an accelerator, a capacitor, a passive component, an inductor, or an active component.

Example 11 may include a method for forming an integrated circuit (IC) package, the method comprising: providing a package substrate, wherein the package substrate includes a set of validation connectors formed on a first side of the package substrate, a first set of functional connectors formed on the first side of the package substrate, and a second set of functional connectors formed on a second side of the package substrate, wherein the second side is opposite to the first side of the package substrate; and placing an IC die above the first side of the package substrate, wherein a validation connector of the set of validation connectors is arranged to be coupled with a validation connector of the IC die, a first functional connector of the first set of functional connectors is arranged to be coupled with a functional connector of the IC die, and a second functional connector of the second set of functional connectors is arranged to be coupled through the first functional connector to the functional connector of the IC die.

Example 12 may include the method of example 11 and/or some other examples herein, further comprising: placing a socket above the first side of the package substrate, wherein the socket is coupled to the set of validation connectors; and placing an interposer above the socket and coupled to the socket.

Example 13 may include the method of example 11 and/or some other examples herein, further comprising: attaching the IC package to a printed circuit board (PCB).

Example 14 may include the method of example 11 and/or some other examples herein, wherein the package substrate includes a through via, a solder resist layer, a metal layer, a mold layer, an underfill layer, or a core substrate, wherein the underfill layer includes epoxy resin, acrylates, bismaleimides, polyesters, polyimides, polyolefins, polystyrene, polyurethanes, polyurethane resin, silicone resin, or polyester resin, silica, alumina, boron nitride, zinc oxide, a filler material, colorants, inhibitors, ion trappers, stress absorbers, polymers, surfactants, binding agents, fluxing agents, or additives; and wherein the core substrate includes a polymeric substrate, a non-polymeric substrate, a silicon substrate, a silicon on insulator (SOI) substrate, a silicon on sapphire (SOS) substrate.

Example 15 may include the method of example 11 and/or some other examples herein, wherein at least one of the validation connector, the first functional connector, and the second functional connector is a pin, a solder ball, a micro ball, a solder bump, a controlled-collapse chip connection (C4) bump, a bonding pad, a through via, a micro via.

Example 16 may include the method of example 11 and/or some other examples herein, wherein the set of validation connectors, the first set of functional connectors, or the second set of functional connectors form a micro pin-grid array (PGA), a land-grid array (LGA), a fine-pitch ball-grid-array (FPBGA), or a ball grid array (BGA).

Example 17 may include the method of example 11 and/or some other examples herein, wherein the IC package is a chip scale package (CSP), a wafer-level package (WLP), a stacked IC package, a system-in-package (SiP), a multi-chip package (MCP), a quad-flat no-leads (QFN) package, a dual-flat no-leads (DFN) package, a flip chip package, or a ball grid array (BGA) package.

Example 18 may include a computing device, comprising: a circuit board; and an integrated circuit (IC) package attached to the circuit board, wherein the IC package includes a package substrate, and the package substrate includes: a set of validation connectors formed on a first side of the package substrate, wherein a validation connector of the set of validation connectors is arranged to be coupled with a validation connector of an IC die placed above the first side of the package substrate; a first set of functional connectors formed on the first side of the package substrate, wherein a first functional connector of the first set of functional connectors is arranged to be coupled with a functional connector of the IC die; and a second set of functional connectors formed on a second side of the package substrate, wherein the second side is opposite to the first side of the package substrate, wherein a second functional connector of the second set of functional connectors is arranged to be coupled through the first functional connector to the functional connector of the IC die.

Example 19 may include the computing device of example 18 and/or some other examples herein, wherein the IC die is a first IC die, and the validation connector of the set of validation connectors is arranged to be coupled with a validation connector of a second IC die replacing the first IC die; and wherein the first functional connector of the first set of functional connectors is arranged to be coupled with a functional connector of the second IC die, and the second functional connector of the second set of functional connectors is arranged to be coupled through the first functional connector to the functional connector of the second integrated circuit.

Example 20 may include the computing device of example 18 and/or some other examples herein, wherein the validation connector of the set of validation connectors is a first validation connector of a first set of validation connectors formed on the first side of the package substrate, the validation connector of the IC die is a first validation connector of the IC die; wherein the package substrate further includes a second set of validation connectors formed on the first side of the package substrate, and a second validation connector of the second set of validation connectors is arranged to be coupled with a second validation connector of the IC die; and wherein the IC die is placed above the first side of the package substrate, between the first set of validation connectors and the second set of validation connectors.

Example 21 may include the computing device of example 18 and/or some other examples herein, wherein the IC package further includes: a socket placed above the first side of the package substrate, wherein the socket is coupled to the set of validation connectors; and an interposer placed above the socket and coupled to the socket.

Example 22 may include the computing device of example 18 and/or some other examples herein, wherein the package substrate includes a through via, a solder resist layer, a metal layer, a mold layer, an underfill layer, or a core substrate, wherein the underfill layer includes epoxy resin, acrylates, bismaleimides, polyesters, polyimides, polyolefins, polystyrene, polyurethanes, polyurethane resin, silicone resin, or polyester resin, silica, alumina, boron nitride, zinc oxide, a filler material, colorants, inhibitors, ion trappers, stress absorbers, polymers, surfactants, binding agents, fluxing agents, or additives; and wherein the core substrate includes a polymeric substrate, a non-polymeric substrate, a silicon substrate, a silicon on insulator (SOI) substrate, a silicon on sapphire (SOS) substrate.

Example 23 may include the computing device of example 18 and/or some other examples herein, wherein at least one of the validation connector, the first functional connector, and the second functional connector is a pin, a solder ball, a micro ball, a solder bump, a controlled-collapse chip connection (C4) bump, a bonding pad, a through via, a micro via.

Example 24 may include the computing device of example 18 and/or some other examples herein, wherein the IC package is a chip scale package (CSP), a wafer-level package (WLP), a stacked IC package, a system-in-package (SiP), a multi-chip package (MCP), a quad-flat no-leads (QFN) package, a dual-flat no-leads (DFN) package, a flip chip package, or a ball grid array (BGA) package.

Example 25 may include the computing device of example 18 and/or some other examples herein, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC) package, comprising:
a package substrate;
a first set of one or more validation connectors on a first side of the package substrate, coupled with a set of one or more validation connectors of an IC die that is coupled with the first side of the package substrate, wherein the first set of one or more validation connectors is in an area between the IC die and the package substrate;
a second set of one or more validation connectors on the first side of the package substrate, coupled with the first set of one or more validation connectors, wherein the second set of one or more validation connectors is lateral of the IC die, outside of the area between the IC die and the package substrate; and
an interposer coupled to the second set of one or more validation connectors at a first side of the interposer, wherein the interposer includes, at a second side of the interposer opposite the first side of the interposer, one or more connectors configured to couple with a debug apparatus.

2. The IC package of claim 1, wherein the debut apparatus comprises at least one of an oscilloscope or a logic analyzer to debug the IC die.

3. The IC package of claim 1, further comprising a socket positioned between the second set of one or more validation connectors and the interposer.

4. The IC package of claim 3, wherein the socket is to couple the interposer to the second set of one or more validation connectors. first side of the package substrate, the validation connector of the IC die is a first validation connector of the IC die; wherein the package substrate further includes a second set of validation connectors formed on the first side of the package substrate, and a second validation connector of the second set of validation connectors is arranged to be coupled with a second validation connector of the IC die; and wherein the IC die is placed above the first side of the package substrate, between the first set of validation connectors and the second set of validation connectors.

5. The IC package of claim 1, further comprising a first functional connector at a first side of the package substrate and the second functional connector at a second side of the package substrate;
wherein the first functional connector is coupled with a functional connector of the IC die; and
wherein the second functional connector is coupled with the first functional connector.

6. The IC package of claim 1, wherein the second set of one or more validation connectors is coupled with the first set of one or more validation connectors via the package substrate.

7. The IC package of claim 1, wherein the second set of one or more validation connectors comprise pads.

8. The IC package of claim 1, wherein the second set of one or more validation connectors comprise a standard pad pattern compatible with multiple IC dies.

9. The IC package of claim 5, wherein the functional connector of the IC die is configured for input/output.

10. The IC package of claim 1, wherein the interposer extends around the IC die.

11. The IC package of claim 3, wherein the socket extends around the IC die.

12. The IC package of claim 3, wherein the socket is removable from the second set of one or more validation connectors.

13. A computing device comprising:
a circuit board; and
an integrated circuit (IC) package attached to the circuit board, wherein the IC package comprises:
  a package substrate with a first set of one or more validation connectors on a first side of the package substrate, wherein a validation connector of the first set of validation connectors is communicatively coupled with a validation connector of an IC die that is coupled with the first side of the package substrate;
  a first interposer communicatively coupled to the first set of one or more validation connectors at a first side of the interposer, wherein the first interposer includes one or more connectors at a second side of the first interposer opposite the first side of the first interposer, wherein the one or more connectors at the second side of the first interposer are configured to communicate debug signals;
  a second set of one or more validation connectors on the first side of the package substrate, wherein a validation connector of the second set of validation connectors is communicatively coupled with a second validation connector of the IC die; and
  a second interposer communicatively coupled to the second set of one or more validation connectors at a first side of the second interposer, wherein the second interposer includes one or more connectors at a second side of the second interposer opposite the first side of the second interposer, and the one or more connectors at the second side of the second interposer are configured to communicate debug signals.

14. The computing device of claim 13, wherein the one or more connectors at the second side of the first interposer are configured to communicate the debug signals with a debug apparatus comprising at least one of an oscilloscope or a logic analyzer.

15. The computing device of claim 13, wherein the IC package further includes a socket positioned between the first set of one or more validation connectors and the first interposer.

16. The computing device of claim 15, wherein the socket is to communicatively couple the first interposer to the first set of one or more validation connectors.

17. The computing device of claim 15, wherein the socket is removable from the first set of validation connectors.

18. The computing device of claim 13, wherein the IC package further includes a first functional connector at a first side of the package substrate and a second functional connector at a second side of the package substrate;
  wherein the first functional connector is coupled with a functional connector of the IC die; and
  wherein the second functional connector is communicatively coupled with the first functional connector.

19. A method of forming an integrated circuit (IC) package, wherein the method comprises:
  placing an IC die above a first side of a package substrate, wherein first and second sets validation connectors are on the first side of the package substrate, the first set of validation connectors is under the IC die, the second set of validation connectors is lateral of the IC die, on opposing sides of the IC die, the first set of validation connectors is coupled with a set of validation connectors of the IC die, and the second set of validation connectors is coupled with the first set of validation connectors; and
  placing an interposer above the second set of validation connectors to couple a first side of the interposer, to the second set of validation connectors, wherein the interposer includes a set of connectors at a second side of the interposer opposite the first side of the interposer, and the set of connectors at the second side of the interposer is configured to couple with a debug apparatus.

20. The method of claim 19, wherein the debug apparatus comprises at least one of an oscilloscope or a logic analyzer.

21. The method of claim 19, further comprising placing a socket above the first side of the package substrate, wherein the interposer is placed above the socket.

22. The method of claim 21, wherein the socket is to communicatively couple the interposer to the second set of validation connectors.

23. The method of claim 19, wherein the IC package further includes a first functional connector at a first side of the package substrate and a second functional connector at a second side of the package substrate;
  wherein the first functional connector is coupled with a functional connector of the IC die; and
  wherein the second functional connector is communicatively coupled with the first functional connector.

24. The method of claim 19, wherein the second set of validation connectors is coupled with the first set of validation connectors via the package substrate.

25. The method of claim 21, wherein the socket is removable from a second set of validation connectors.

* * * * *

UNITED STATES PATENT AND TRADEMARK OFFICE
CERTIFICATE OF CORRECTION

| | | |
|---|---|---|
| PATENT NO. | : 12,322,685 B2 | Page 1 of 1 |
| APPLICATION NO. | : 16/895964 | |
| DATED | : June 3, 2025 | |
| INVENTOR(S) | : Luis Ricardo Perez-Corona et al. | |

It is certified that error appears in the above-identified patent and that said Letters Patent is hereby corrected as shown below:

In the Claims

Column 16:

Line 32 "The IC package of claim 1, wherein the debut apparatus" should read --The IC package of claim 1, wherein the debug apparatus--

Lines 40-50 "validation connectors. first side of the package substrate, the validation connector of the IC die is a first validation connector of the IC die; wherein the package substrate further includes a second set of validation connectors formed on the first side of the package substrate, and a second validation connector of the second set of validation connectors is arranged to be coupled with a second validation connector of the IC die; and wherein the IC die is placed above the first side of the package substrate, between the first set of validation connectors and the second set of validation connectors." should read --validation connectors.--

Line 53 "and the second functional connector at a second side of the" should read --and a second functional connector at a second side of the--

Column 18:

Line 14 "wherein first and second sets validation connectors are" should read --wherein first and second sets of validation connectors are--

Line 51 "removable from a second set of validation connectors." should read --removable from the second set of validation connectors.--

Signed and Sealed this
Eighth Day of July, 2025

Coke Morgan Stewart
*Acting Director of the United States Patent and Trademark Office*